(12) United States Patent
Cheng et al.

(10) Patent No.: US 8,309,447 B2
(45) Date of Patent: Nov. 13, 2012

(54) METHOD FOR INTEGRATING MULTIPLE THRESHOLD VOLTAGE DEVICES FOR CMOS

(75) Inventors: Kangguo Cheng, Guilderland, NY (US); Bruce B. Doris, Yorktown Heights, NY (US); Lisa F. Edge, Watervliet, NY (US); Balasubramanian S. Haran, Watervliet, NY (US); Hemanth Jagannathan, Guilderland, NY (US); Ali Khakifirooz, Slingerlands, NY (US); Vamsi K. Paruchuri, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 71 days.

(21) Appl. No.: 12/855,273

(22) Filed: Aug. 12, 2010

(65) Prior Publication Data

US 2012/0040522 A1 Feb. 16, 2012

(51) Int. Cl.
*H01L 21/3205* (2006.01)
*H01L 21/4763* (2006.01)

(52) U.S. Cl. ........ 438/585; 438/158; 438/199; 438/233; 438/591; 257/E21.632; 257/E21.19; 257/E27.062

(58) Field of Classification Search .................. 438/158, 438/199, 585, 591; 257/369, E21.294, E21.177, 257/E21.635, E21.639, E21.642, E27.062
See application file for complete search history.

(56) References Cited

U.S. PATENT DOCUMENTS

| | | | | |
|---|---|---|---|---|
| 2007/0138565 A1* | 6/2007 | Datta et al. | | 257/369 |
| 2009/0011552 A1* | 1/2009 | Doris et al. | | 438/199 |
| 2009/0108365 A1* | 4/2009 | Tseng et al. | | 257/369 |
| 2010/0197128 A1* | 8/2010 | Schaeffer et al. | | 438/591 |
| 2011/0042751 A1* | 2/2011 | Kim et al. | | 257/369 |

* cited by examiner

*Primary Examiner* — Charles Garber
*Assistant Examiner* — Abdulfattah Mustapha
(74) *Attorney, Agent, or Firm* — Scully, Scott, Murphy & Presser, P.C.; Louis J. Percello, Esq.

(57) ABSTRACT

A method to achieve multiple threshold voltage (Vt) devices on the same semiconductor chip is disclosed. The method provides different threshold voltage devices using threshold voltage adjusting materials and a subsequent drive in anneal instead of directly doping the channel. As such, the method of the present disclosure avoids short channel penalties. Additionally, no ground plane/back gates are utilized in the present application thereby the method of the present disclosure can be easily integrated into current complementary metal oxide semiconductor (CMOS) processing technology.

27 Claims, 6 Drawing Sheets

METHOD FOR INTEGRATING MULTIPLE THRESHOLD VOLTAGE DEVICES FOR CMOS

BACKGROUND

The present disclosure relates to a method of fabricating a semiconductor structure. More particularly, the present disclosure relates to a method for integrating multiple threshold voltage (Vt) devices on the same semiconductor chip.

Scaling bulk semiconductor technology beyond the 20 nm node faces formidable challenges, particularly for low power applications, due to the competing requirement of density, power and performance, and partially due to the increase in device variation and parasitic.

Extremely thin semiconductor-on-insulator (ETSOI) substrates have been recognized as a viable device architecture due to its superior short-channel control, inherent low device variability, and compatibility with current mainstream planar complementary metal oxide semiconductor (CMOS) processing. System-on-chip applications require various sets of transistors to achieve optimal tradeoff between power and performance. The lack of channel doping in ETSOI requires that multiple threshold voltage devices be achieved through techniques other than doping techniques.

In view of the above, there is a need for providing a method to achieve multiple threshold voltage devices (such as low, medium and high threshold voltage) on the same chip for applications with ETSOI and other semiconductor substrates. In particular, a method is needed that is simpler than the prior art and, which overcomes several challenges that are associated with current gate-first integration schemes.

SUMMARY

The present disclosure provides a method to achieve multiple threshold voltage (Vt) devices on the same semiconductor chip. The method of the present application is simpler than prior art methods and it overcomes many of the challenges that are present in current gate-first integration schemes. The method of the present application is applicable for ETSOI substrates, SOI substrates, bulk semiconductors and substrates including a semiconductor fin located on an upper surface thereof.

The method of the present disclosure provides different threshold voltage devices using threshold voltage adjusting materials and a subsequent drive in anneal instead of directly doping the channel. As such, the method of the present disclosure avoids short channel penalties, which occur using prior art doping techniques to achieve the different threshold voltage devices. Additionally, no ground plane/back gates are utilized in the present application thereby the method of the present disclosure can be easily integrated into current complementary metal oxide semiconductor (CMOS) processing technology.

In one embodiment, a method of forming multiple threshold voltage devices on a same semiconductor chip is provided. The method includes providing an initial structure including a semiconductor substrate having at least an nMOS device region and a pMOS device region located therein, wherein a high k gate dielectric layer is located atop the semiconductor substrate in each of the device regions; forming a disposable mask atop the high k gate dielectric layer in each of the device regions; forming a first patterned mask protecting one of device regions, while leaving the other device region unprotected; removing an exposed portion of the disposable mask in the device region not protected by the first patterned mask to expose an underlying portion of the high k gate dielectric layer and removing the first patterned mask; forming a first material stack including a bottom layer comprising either an nFET threshold voltage adjusting material layer or a pFET threshold voltage adjusting material layer in each device region, wherein a portion of the nFET or pFET threshold voltage adjusting material layer is in contact with the exposed portion of the high k gate dielectric layer in the one device region; forming a second patterned mask atop the first material stack in the one device region, while leaving the other device region unprotected; removing exposed material layers within the other device region, stopping atop a portion of the high k gate dielectric layer in the other device region and removing the second patterned mask; forming a second material stack including a bottom layer comprising the other of the pFET or nFET threshold voltage adjusting material layer not present in the first material stack in each device region, wherein a portion of the pFET or nFET threshold voltage adjusting material layer of the second material stack is in contact with the exposed portion of the high k gate dielectric layer in the other device region; performing an anneal, wherein the portion of the high k gate dielectric layer that is in contact with the nFET threshold voltage adjusting material layer is converted to a dielectric-containing nFET threshold voltage adjusted region and wherein the portion of the high k gate dielectric layer that is in contact with the pFET threshold voltage adjusting material layer is converted to a dielectric-containing pFET threshold voltage adjusted region; and removing all material layers located above the dielectric-containing nFET threshold voltage adjusted region and the dielectric-containing pFET threshold voltage adjusted region.

In another embodiment, the method can include providing an initial structure including a semiconductor substrate having at least an nMOS device region and a pMOS device region located therein, wherein a high k gate dielectric layer is located atop the semiconductor substrate in each of the device regions; forming a disposable mask atop the high k gate dielectric layer in each of the device regions; forming a first patterned mask protecting the nMOS device region, while leaving the pMOS region unprotected; removing an exposed portion of the disposable mask in the pMOS device region not protected by the first patterned mask to expose an underlying portion of the high k gate dielectric layer and removing the first patterned mask; forming a first material stack including a bottom layer comprising a pFET threshold voltage adjusting material layer in each device region, wherein a portion of the pFET threshold voltage adjusting material layer is in contact with the exposed portion of the high k gate dielectric layer in the pMOS device region; forming a second patterned mask atop the first material stack in the pMOS device region, while leaving the nMOS device region unprotected; removing exposed material layers within the nMOS device region, stopping atop a portion of the high k gate dielectric layer in the nMOS device region and removing the second patterned mask; forming a second material stack including a bottom layer comprising an nFET threshold voltage adjusting material layer in each device region, wherein a portion of the nFET threshold voltage adjusting material layer is in contact with the exposed portion of the high k gate dielectric layer in the nMOS device region; performing an anneal, wherein the portion of the high k gate dielectric layer that is in contact with the nFET threshold voltage adjusting material layer is converted to a dielectric-containing nFET threshold voltage adjusted region and wherein the portion of the high k gate dielectric layer that is in contact with the pFET threshold voltage adjusting material layer is converted to a dielectric-containing pFET threshold voltage adjusted region; and removing all remaining material layers located above the dielectric-containing nFET threshold voltage adjusted region and the dielectric-containing pFET threshold voltage adjusted region.

In yet another embodiment, the method includes providing an initial structure including a semiconductor substrate having at least an nMOS device region and a pMOS device region located therein, wherein a high k gate dielectric layer is located atop the semiconductor substrate in each of the device regions; forming a disposable mask atop the high k gate dielectric layer in each of the device regions; forming a first patterned mask protecting the pMOS device region, while leaving the nMOS region unprotected; removing an exposed portion of the disposable mask in the nMOS device region not protected by the first patterned mask to expose an underlying portion of the high k gate dielectric layer and removing the first patterned mask; forming a first material stack including a bottom layer comprising an nFET threshold voltage adjusting material layer in each device region, wherein a portion of the nFET threshold voltage adjusting material layer is in contact with the exposed portion of the high k gate dielectric layer in the nMOS device region; forming a second patterned mask atop the first material stack in the nMOS device region, while leaving the pMOS device region unprotected; removing exposed material layers within the pMOS device region, stopping atop a portion of the high k gate dielectric layer in the pMOS device region and removing the second patterned mask; forming a second material stack including a bottom layer comprising a pFET threshold voltage adjusting material layer in each device region, wherein a portion of the pFET threshold voltage adjusting material layer is in contact with the exposed portion of the high k gate dielectric layer in the pMOS device region; performing an anneal, wherein the portion of the high k gate dielectric layer that is in contact with the nFET threshold voltage adjusting material layer is converted to a dielectric-containing nFET threshold voltage adjusted region and wherein the portion of the high k gate dielectric layer that is in contact with the pFET threshold voltage adjusting material layer is converted to a dielectric-containing pFET threshold voltage adjusted region; and removing all material layers located above the dielectric-containing nFET threshold voltage adjusted region and the dielectric-containing pFET threshold voltage adjusted region.

DETAILED DESCRIPTION

The present disclosure, which provides a method of forming multiple threshold voltage devices on a same semiconductor chip, will now be described in greater detail by referring to the following discussion and drawings that accompany the present application. It is noted that the drawings are provided for illustrative purposes only and are not drawn to scale.

In the following description, numerous specific details are set forth, such as particular structures, components, materials, dimensions, processing steps and techniques, in order to illustrate the present disclosure. However, it will be appreciated by one of ordinary skill in the art that various embodiments of the present disclosure may be practiced without these, or with other, specific details. In other instances, well-known structures or processing steps have not been described in detail in order to avoid obscuring the various embodiments of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Reference is now made to FIGS. 1A, 1B and 2-11 which illustrate an embodiment of the present application. Although the embodiment of the present application illustrates the opening and processing of the pMOS device region prior to the opening and processing of the nMOS device region, the present disclosure also contemplates opening and processing the nMOS device region first, followed by the opening and processing of the pMOS device region. When the nMOS device region is opened and processed prior to that of the pMOS device region, the nFET threshold adjusting material layer is used in the first material stack and then the pFET threshold voltage adjusting material layer is used in the second material stack.

Figure 1A:
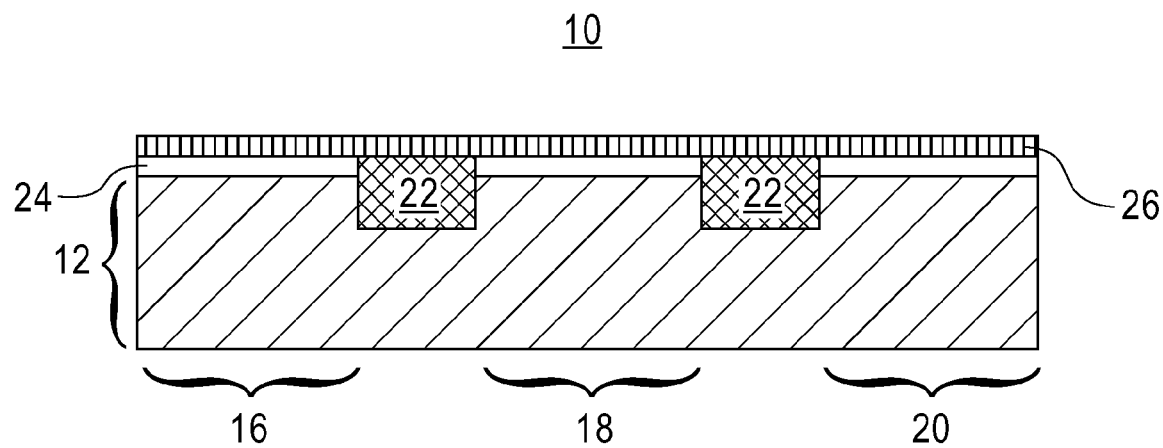
FIG. 1A is a pictorial representation (through a cross sectional view) depicting an initial structure including a semiconductor substrate having an nMOS device region, a pMOS device region and an optional mid gap nMOS/pMOS device region, wherein a high k gate dielectric layer is located atop the substrate in each of the device regions in accordance with an embodiment of the present disclosure.

Reference is first made to FIG. 1A which illustrates an initial structure 10 that can be employed in one embodiment of the present disclosure. The initial structure 10 shown in FIG. 1A includes a semiconductor substrate 12 having an nMOS device region 16, a pMOS device region 18 and an optional mid gap nMOS/pMOS device region 20. Each of the various device regions present in the semiconductor substrate 12 are separated by an isolation region 22. The initial structure 10 shown in FIG. 1A further includes an optional chemox layer 24 located atop, or within, the semiconductor substrate 12 in each device region and a high k gate dielectric layer 26 either atop the optional chemox layer 24, if present, or atop the semiconductor substrate 12, if the optional chemox layer 24 is not present.

The initial structure 10 shown in FIG. 1A is made utilizing processes that are well known in the art and the various elements referenced therein are comprised of materials that are also well known to those skilled in the art.

When an SOI substrate (not specifically shown) is employed as semiconductor substrate 12, the SOI substrate includes a handle substrate, a buried insulating layer located on an upper surface of the handle substrate, and a semiconductor layer located on an upper surface of the buried insulating layer. The handle substrate and the semiconductor layer of the SOI substrate may comprise the same, or different, semiconductor material. The term "semiconductor" as used herein in connection with the semiconductor material of the handle substrate and the semiconductor layer denotes any semiconducting material including, for example, Si, Ge, SiGe, SiC, SiGeC, InAs, GaAs, InP or other like III/V compound semiconductors. Multilayers of these semiconductor materials can also be used as the semiconductor material of the handle substrate and the semiconductor layer. In one embodiment, the handle substrate and the semiconductor layer are both comprised of Si. In another embodiment, hybrid SOI substrates are employed which have different surface regions of different crystallographic orientations.

The handle substrate and the semiconductor layer may have the same or different crystal orientation. For example, the crystal orientation of the handle substrate and/or the semiconductor layer may be {100}, {110}, or {111}. Other crystallographic orientations besides those specifically mentioned can also be used in the present disclosure. The handle substrate and/or the semiconductor layer of the SOI substrate may be a single crystalline semiconductor material, a polycrystalline material, or an amorphous material. Typically, at least the semiconductor layer is a single crystalline semiconductor material.

The buried insulating layer of the SOI substrate may be a crystalline or non-crystalline oxide or nitride. In one embodiment, the buried insulating layer is an oxide. The buried insulating layer may be continuous or it may be discontinuous. When a discontinuous buried insulating region is present, the insulating region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

The thickness of the semiconductor layer of the SOI substrate is typically from 100 Å to 1000 Å, with a thickness from 500 Å to 700 Å being more typical. In some embodiments, and when an ETSOI substrate is employed, the semiconductor layer of the SOI has a thickness of less than 100 Å. If the thickness of the semiconductor layer is not within one of the above mentioned ranges, a thinning step such as, for example, planarization or etching can be used to reduce the thickness of the semiconductor layer to a value within one of the ranges mentioned above.

The buried insulating layer of the SOI substrate typically has a thickness from 10 Å to 2000 Å, with a thickness from 1000 Å to 1500 Å being more typical. The thickness of the handle substrate of the SOI substrate is inconsequential to the present disclosure.

In some embodiments of the present disclosure, the semiconductor substrate 12 is a bulk semiconductor substrate. When a bulk semiconductor substrate is employed as semiconductor substrate 12, the bulk semiconductor substrate is comprised of any semiconductor material including, but not limited to, Si, Ge, SiGe, SiC, SiGeC, InAs, GaAs, InP or other like III/V compound semiconductors. Multilayers of these semiconductor materials can also be used as the semiconductor material of the bulk semiconductor. In one embodiment, the bulk semiconductor substrate is comprised of Si.

The semiconductor substrate 12 may be doped, undoped or contain doped and undoped regions therein. For clarity, the doped regions are not specifically shown in the drawings of the present application. Each doped region within the semiconductor substrate 12 may have the same, or they may have different conductivities and/or doping concentrations. The doped regions that are present in the semiconductor substrate 12 are typically referred to as well regions and they are formed utilizing a conventional ion implantation process or gas phase doping.

At least one isolation region 22 is optionally formed into the semiconductor substrate 12; the at least one isolation region is typically used when planar semiconductor devices, such as planar FETs, are to be formed. The at least one isolation region 22 may be a trench isolation region or a field oxide isolation region. The at least one trench isolation region is formed utilizing a conventional trench isolation process well known to those skilled in the art. For example, a trench isolation region can be formed by lithography, etching, and filling a trench with a trench dielectric. Optionally, a liner may be formed in the trench prior to trench fill, a densification process may be performed after the trench fill and a planarization process may follow the trench fill. Field oxide regions may be formed utilizing a so-called local oxidation of silicon process. Note that the at least one isolation region provides isolation between neighboring semiconductor devices, typically required when the neighboring semiconductor devices have different conductivities.

If present, the optional chemox layer 24 can be formed on, or within, the semiconductor substrate 12 in each device region prior to forming the high k gate dielectric layer 26. The optional chemox layer 24 is formed utilizing a conventional growing technique that is well known to those skilled in the art including, for example, oxidation or oxynitridation. In some embodiments, the optional chemox layer 24 is formed by a wet chemical oxidation process. When the semiconductor substrate 12 is a Si-containing semiconductor, the optional chemox layer 24 is comprised of silicon oxide, silicon oxynitride or a nitrided silicon oxide. When the semiconductor substrate 12 is other than a Si-containing semiconductor, the optional chemox layer 24 may comprise a semiconducting oxide, a semiconducting oxynitride or a nitrided semiconducting oxide. The thickness of the optional chemox layer 24 is typically from 0.5 nm to 1.5 nm, with a thickness from 0.8 nm to 1 nm being more typical. The thickness, however, may be different after processing at higher temperatures, which are usually required during FET or CMOS fabrication.

The high k gate dielectric layer 26 is comprised of an insulating material having a dielectric constant of greater than silicon oxide, i.e., 4.0 or greater. All dielectric constants mentioned herein are relative to a vacuum unless otherwise noted. Specifically, the high k gate dielectric layer 26 that can be employed includes, but is not limited to, an oxide, nitride, oxynitride and/or silicate including metal silicates and nitrided metal silicates. In one embodiment, the high k gate dielectric layer 26 can be comprised of an oxide such as, for example, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Multilayered stacks of these high k materials can also be employed as the high k gate dielectric layer 26. Each value of x is independently from 0.5 to 3 and each value of y is independently from 0 to 2. In some embodiments, $HfO_2$, hafnium silicate and hafnium silicon oxynitride are employed as the high k gate dielectric layer 26. The physical thickness of the high k gate dielectric layer 26 may vary, but typically, the high k gate dielectric layer 26 has a thickness from 0.5 nm to 10 nm, with a thickness from 0.5 nm to about 3 nm being more typical.

The high k gate dielectric layer 26 can be formed by a deposition process such as, for example, chemical vapor deposition (CVD), plasma-assisted CVD, metalorganic chemical vapor deposition (MOCVD), atomic layer deposition (ALD), evaporation, reactive sputtering, chemical solution deposition and other like deposition processes. The high k gate dielectric layer 26 may also be formed utilizing any combination of the above processes. In some embodiments, the gate dielectric material within each of the various device regions is different. Different gate dielectric materials can be formed by utilizing block mask technology.

Figure 1B:
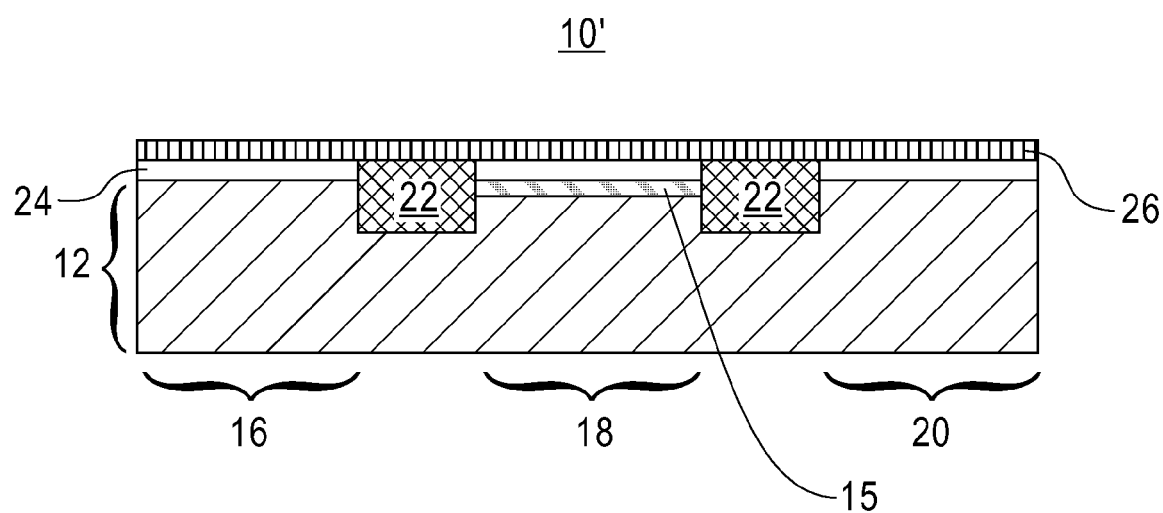
FIG. 1B is a pictorial representation (through a cross sectional view) depicting another initial structure including a semiconductor substrate having an nMOS device region, a pMOS device region and an optional mid gap nMOS/pMOS device region, wherein a high k gate dielectric layer is located atop the substrate in each of the device regions and a semiconductor layer having a different lattice constant than the substrate is located in the pMOS device region in accordance with another embodiment of the present disclosure.

Referring now to FIG. 1B, there is illustrated another initial structure 10' that can be employed in the present application. The another initial structure 10' includes each of the elements mentioned above in regard to the initial structure 10 shown in FIG. 1A plus a semiconductor material layer 15 having a lattice constant that is different from the lattice constant of the semiconductor substrate 12. The semiconductor material layer 15 is present only within the pMOS device region 18 as is shown in FIG. 1B. When an SOI substrate is employed, the semiconductor material layer 15 has a different lattice constant as compared with the lattice constant of the upper most semiconductor layer of the SOI substrate.

The semiconductor layer 15 is typically composed of a semiconductor material that is different than that of the upper most semiconductor layer of semiconductor substrate 12. In one embodiment, the semiconductor layer 15 has a larger lattice constant than that of the upper most semiconductor layer of the semiconductor substrate 12 in the pMOS device region 18. In another embodiment, the semiconductor layer 15 has a smaller lattice constant than that of the upper most semiconductor layer of the semiconductor substrate 12 in the pMOS device region 18. In one example, and when the upper most semiconductor layer of the semiconductor substrate 12 is comprised of Si, the semiconductor layer 15 can be comprised of SiGe.

The semiconductor layer 15 can be formed utilizing a conventional deposition process such as, for example, epitaxial growth. A block mask can be present on the other device regions, i.e., the nMOS device region 16 and the optional mid gap nMOS/pMOS device region 20. The thickness of the semiconductor layer 15 can vary depending on the type of semiconductor material employed, as well as the method that is used in forming the same. Typically, the semiconductor layer 15 has a thickness from 0.5 nm to 20 nm, with a thickness from 5 nm to 10 nm being more typical. It is observed that the initial structure 10' shown in FIG. 1B can be used for integrating different threshold devices in PDSOI and bulk semiconductor substrates.

In some embodiments, not shown, the initial structure includes a plurality of parallel oriented semiconductor fins located on a substrate. When a fin containing initial structure is employed, a hard mask can be present on an uppermost surface of the semiconductor substrate 12 shown in FIG. 1A or 1B. The hard mask can be formed utilizing a conventional deposition process such as, for example, chemical vapor deposition (CVD), plasma enhanced chemical vapor deposition (PECVD), chemical solution deposition, evaporation or other like deposition processes. Alternatively, the hard mask can be formed by a thermal process such as, for example, oxidation or nitridation. Any combination of the above mentioned processes can also be used in forming the hard mask.

The hard mask can comprise an oxide, nitride, oxynitride or any combination thereof including multilayers. In one embodiment, the hard mask is an oxide including, for example, silicon oxide or silicon nitride. The thickness of the hard mask may vary depending on the technique used in forming the same, the material of the hard mask itself, and the number of layers within the hard mask layer. Typically, the hard mask has a thickness from 200 Å to 800 Å, with a thickness from 400 Å to 600 Å being more typical.

At least one parallel oriented semiconducting body is then formed in each of the device regions. Each of the semiconductor bodies that are formed extends from a surface of the semiconductor substrate 12. It is noted that each of the parallel oriented semiconducting bodies thus formed has a narrow width on the order of 20 nm or less and, a vertical thickness of less than 100 Å for an ESTSOI substrate or a vertical thickness from 100 Å to 1000 Å for other types of substrates. It is further noted that other widths and vertical thickness can also be employed in the present disclosure. As such, the semiconducting bodies that are formed are referred hereinafter as semiconductor fins. The plurality of semiconductor fins may be used as semiconductor bodies for nfinFET devices and pfinFET devices. Each of the semiconductor fins can be formed by lithography and etching. The lithographic step includes applying a photoresist (not shown) atop the hard mask, exposing the photoresist to a desired pattern of radiation, and developing the exposed resist utilizing a conventional resist developer. The etching process comprises drying etching and/or wet chemical etching. Illustrative examples of suitable dry etching processes that can be used in the present disclosure include reactive ion etching, ion beam etching, plasma etching or laser ablation. Typically, a reactive ion etching process or an ion beam etching process is used. The etching process first transfers the pattern from the patterned photoresist to the hard mask and thereafter to the underlying semiconductor layer. The patterned photoresist is typically, but not necessarily always, removed after the pattern has been transferred to the hard mask. A conventional resist stripping process is used to remove the patterned photoresist from the structure. Alternatively, the semiconductor fins can also be formed utilizing a conventional sidewall image transfer (SIT) process. In a typical SIT process, a spacer is formed on a dummy mandrel. The dummy mandrel is removed and the remaining spacer is used as a hard mask to etch the semiconductor fins. The spacer is then removed after the semiconductor fins have been formed.

In some embodiments, the hard mask that remains atop the semiconductor fins can be removed. This particular embodiment allows for fabrication of a tri-gated fully depleted non-planar semiconductor device since the high k dielectric to be subsequently formed would be present on the sidewalls and top surface of each of the semiconductor fins. The removal of the hard mask can be achieved by performing a selective etching process or by utilizing a planarization process such as chemical mechanical planarization.

Although the initial structure 10' shown in FIG. 1B or an initial structure including a plurality of fins can be employed, the following description and drawings assume that the initial structure 10 shown in FIG. 1A is employed. In embodiments in which the initial structure 10' or the fin containing initial structure is employed the following processing steps are applicable for those initial structures as well, unless otherwise stated.

Figure 2:
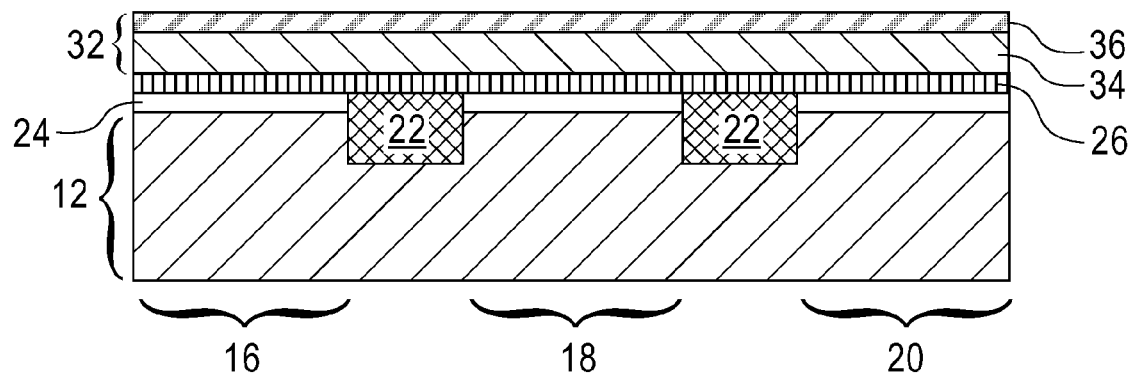
FIG. 2 is a pictorial representation (through a cross sectional view) depicting the initial structure of FIG. 1A after forming a disposable mask including a first barrier layer and a first barrier coating layer atop the high k gate dielectric layer in each of the device regions.

Referring now to FIG. 2, there is shown the initial structure 10 of FIG. 1A after forming a disposable mask 32 including a first barrier layer 34 and a first barrier coating layer 36 atop the high k gate dielectric 26 in each of the device regions.

The first barrier layer 34 can be comprised of a metal nitride such as, for example, TiN, TaN, WN, RuN, RuTaN and IrTaN. In one embodiment, the first barrier layer 34 is comprised of TiN. The first barrier layer 34 can be formed utilizing a deposition including, for example, chemical vapor deposition, plasma enhanced chemical vapor deposition, physical vapor deposition, and sputtering. The thickness of the first barrier layer 34 can vary depending on the type of material employed as the first barrier layer 34 as well as the method of depositing the same. Typically, the first barrier layer 34 has a thickness from 1 nm to 20 nm, with a thickness from 2 nm to 7 nm being more typical.

The barrier coating layer 36 (which represents a first barrier coating layer) can comprise a metal such as, for example Ti or Al, silicon oxide, a silicon based material such as alpha silicon, or a carbon based material such as, for example, alpha carbon or graphene. Multilayers of such materials can also be used as the barrier coating layer 36. In one embodiment, Ti is employed as the barrier coating layer 36. In another embodiment, Al is employed as the barrier coating layer 36. In a further embodiment, alpha silicon is employed as the barrier coating layer 36. It is emphasized that the type of barrier coating layer 36 employed is selected such that it is compatible with the overlying resist material and optional antireflective coating to be subsequent formed. Alternatively, and when finFET devices are being formed, the type of barrier coating layer 36 employed must have a minimal thickness (typically on the order of 3 nm or less).

The barrier coating layer 36 can be formed utilizing any conventional deposition process including, but not limited to, chemical vapor deposition, plasma enhanced chemical vapor deposition, chemical solution deposition, sputtering, electroplating, electroless plating, atomic layer deposition and evaporation. The thickness of the barrier coating layer 36 that is formed may vary depending on the type of barrier coating layer 36 employed as well as the type of device that is formed. For example, when finFETs are being formed the thickness of the barrier coating layer 36 that is formed at this point of the process is typically within a range from 0.2 nm to 3 nm, while when planar devices are being formed, the thickness of the barrier coating layer 36 is typically within a range from 0.5 nm to 5 nm.

Figure 3:
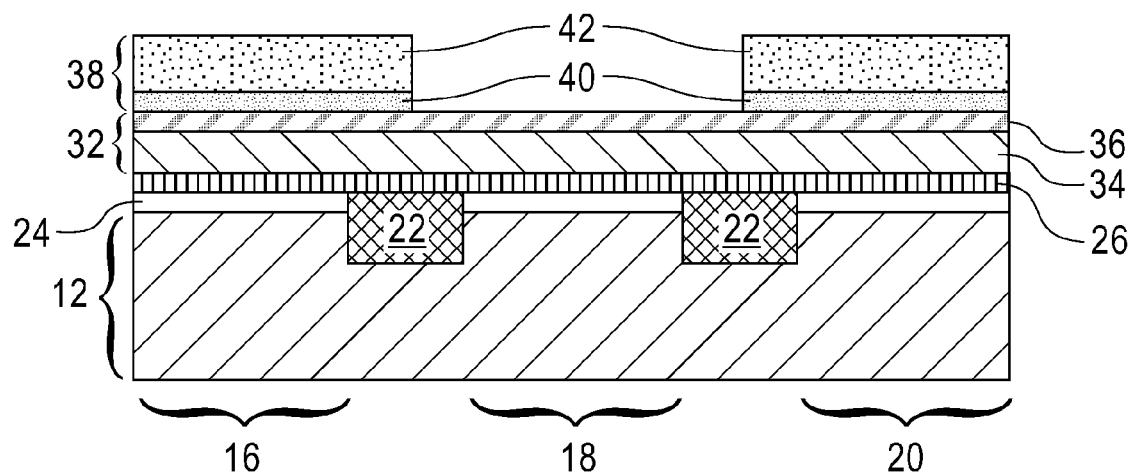
FIG. 3 is a pictorial representation (through a cross sectional view) depicting the structure of FIG. 2 after forming a first patterned mask protecting the material layers within the nMOS device region and the optional mid gap nMOS/pMOs device region, while leaving the material layers in the pMOS device region unprotected.

Referring now to FIG. 3, there is shown the structure of FIG. 2 after forming a first patterned mask 38 protecting the material layers within the nMOS device region 16 and the optional mid gap nMOS/pMOS device region 20, while leaving the material layers in the pMOS device region 18 unprotected. The first patterned mask 38 can include an optional patterned bottom antireflective coating 40 and an overlying patterned photoresist 42.

The first patterned mask 38 can be formed by applying an optional antireflective coating material and/or a photoresist material atop the barrier coating material 36. The optional antireflective coating material includes any conventional antireflective coating material that is well known to those skilled in the art including organic antireflective coating materials and inorganic antireflective coating materials. When present, the optional antireflective coating material can be formed utilizing a conventional deposition process including, but not limited to, spin-on coating, evaporation, chemical solution deposition, and chemical vapor deposition. The photoresist material that can be employed includes any conventional photoresist material that is well known to those skilled in the art including organic photoresist materials and inorganic photoresist materials. The photoresist material is typically a chemically amplified positive-tone or negative-tone polymer, copolymer or a blend of polymers and/or copolymers. The photoresist material can be formed utilizing any conventional deposition process including, for example, spin-on coating, evaporation, chemical solution deposition, chemical vapor deposition and plasma enhanced chemical vapor deposition.

After applying the photoresist material, lithography is used in patterning the photoresist material into patterned photoresist 42. The lithography step includes exposing the photoresist material to a predetermined pattern of radiation and developing the exposed resist utilizing a conventional resist developer. The pattern within the photoresist material is then transferred into underlying portions of the antireflective coating material, if present, by etching. The etching used to transfer the pattern for the patterned photoresist 42 into the underlying portion of the antireflective coating material includes dry etching or wet etching.

Figure 4:
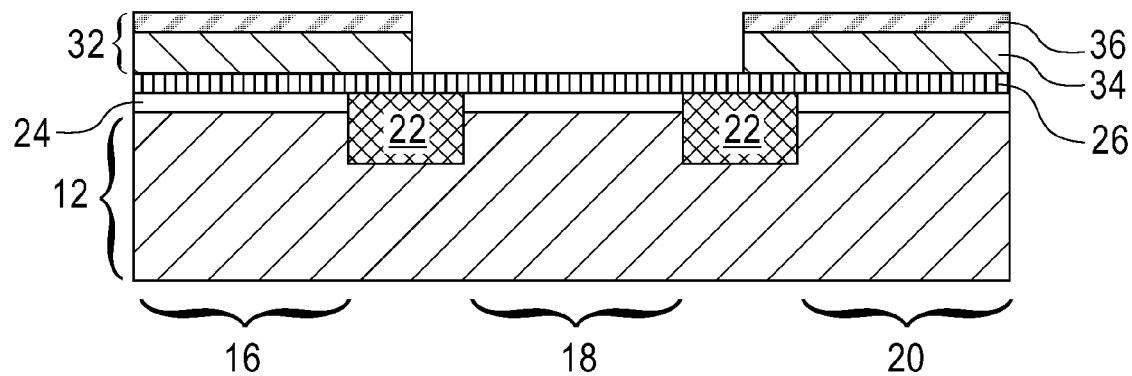
FIG. 4 is a pictorial representation (through a cross sectional view) depicting the structure of FIG. 3 after removing the exposed portions of the disposable mask within the pMOS device region and the subsequent removal of the first patterned mask.

Referring now to FIG. 4, there is shown the structure of FIG. 3 after removing the exposed portion of the disposable mask 32 within the pMOS device region 18 and the subsequent removal of the first patterned mask 38. The removing the exposed portion of the disposable mask 32 within the pMOS device region 18 is performed utilizing an etching process that is selective in removing the exposed portion of the disposable mask 32 relative to the first patterned mask 38, while stopping on an upper surface of the high k gate dielectric layer 26. In one embodiment, the exposed portion of the disposable mask 32 in the pMOS device region 18 that is not protected by the first patterned mask 28 is removed by an ammonia peroxide mixture (APM). The patterned mask 38 can be removed utilizing a conventional resist stripping process such as, for example, ashing.

Figure 5:
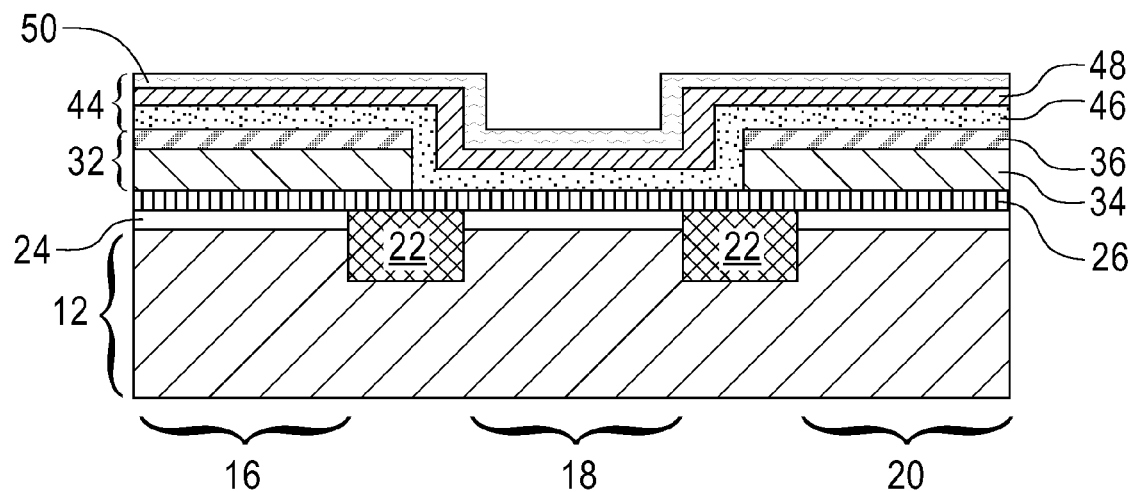
FIG. 5 is a pictorial representation (through a cross sectional view) depicting the structure of FIG. 4 after forming a material stack including, from bottom to top, a pFET threshold adjusting material layer, a second barrier layer and a second barrier coating layer within each of the device regions, wherein in the pMOS device region the pFET threshold voltage adjusting material layer is in direct contact with a portion of the high k gate dielectric layer.

Referring to FIG. 5, there is shown the structure of FIG. 4 after forming a material stack 44 including, from bottom to top, a pFET threshold adjusting material layer 46, a second barrier layer 48 and a second barrier coating layer 50 within each of the device regions, wherein in the pMOS device region 18 the pFET threshold voltage adjusting material layer 46 is in direct contact with a portion of the high k gate dielectric layer 26.

The pFET threshold voltage adjusting material layer 46 includes a material that moves the threshold voltage of a gate stack towards the pFET band edge. Examples of pFET threshold voltage adjusting materials that can be used as layer 46 include Al (and its compounds that are non-conductive such as, for example $Al_2O_3$), Ge (and its compounds that are non-conductive such as, for example $GeO_2$), and non-conductive compounds of Ti and Ta such as, $TiO_2$ and $Ta_2O_5$ respectively.

The pFET threshold voltage adjusting material layer 46 can be formed utilizing conventional deposition processes well known to those skilled in the art including, but not limited to, chemical vapor deposition (CVD), plasma enhanced chemical vapor deposition (PECVD), chemical solution deposition, atomic layer deposition (ALD), physical vapor deposition (PVD), ionized PVD, sputtering and plating.

The thickness of the pFET threshold voltage adjusting material layer 46 may vary depending on the type of pFET threshold voltage adjusting material employed as well as the technique that was used in forming the same. Typically, the pFET threshold voltage adjusting material layer 46 has a thickness from 0.1 nm to 5.0 nm, with a thickness from 1.0 nm to 3.0 nm being more typical.

The second barrier layer 48 can be composed of the same or different metal nitride as the first barrier layer 34. In one embodiment, the first and second barrier layers (34 and 48, respectively) are both comprised of TiN. The second barrier layer 48 can be formed as described above for the first barrier layer 34 and the thickness of the second barrier layer 48 can be within the same thickness regime as that of the first barrier layer 34.

The second barrier coating layer 50 may comprise the same or different material as the first barrier coating layer 36 described above. In one embodiment, the first and second barrier layers (36 and 50, respectively) are comprised of Ti. The second barrier coating layer 50 can be formed utilizing one of the techniques mentioned above for forming the first barrier coating layer 36 and the thickness of the second barrier coating layer 50 is within the thickness regime mentioned above for the first barrier coating layer 36.

Figure 6:
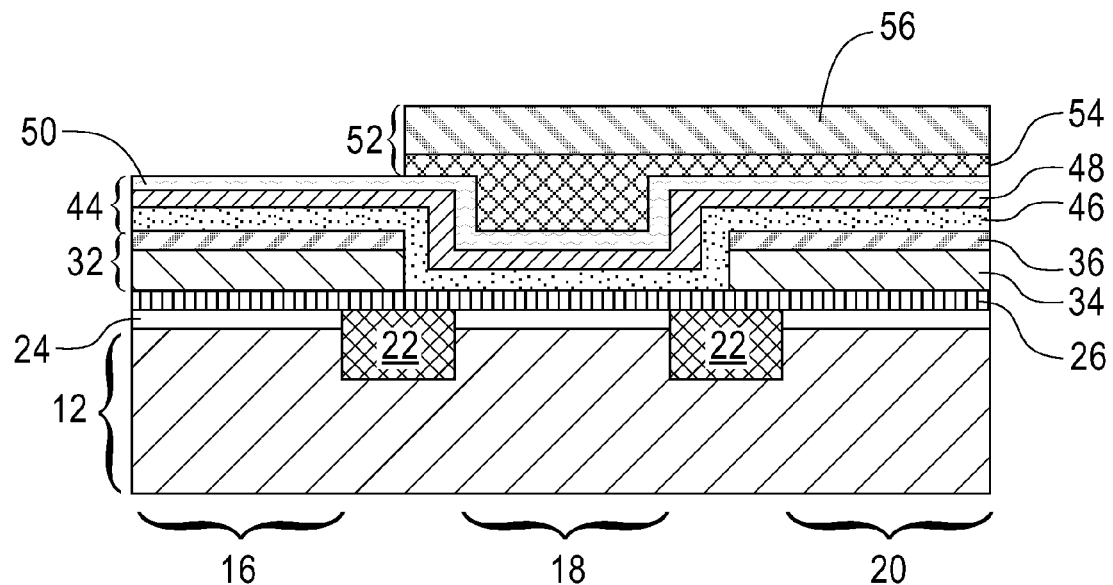
FIG. 6 is a pictorial representation (through a cross sectional view) depicting the structure of FIG. 5 after forming a second patterned mask which protects the material layers within the pMOS device region and the optional mid gap nMOS/pMOS device region, while leaving the material layers within the nMOS device region unprotected.

Referring to FIG. 6, there is shown the structure of FIG. 5 after forming a second patterned mask 52 which protects the material layers within the pMOS device region 18 and the optional mid gap nMOS/pMOS device region 20, while leaving the material layers within the nMOS device region 16 unprotected. The second patterned mask 52 can include an optional second patterned bottom antireflective coating 54 and a second patterned photoresist 56. The materials of the optional second patterned antireflective coating 54 and the second patterned photoresist 56 can include one of the materials mentioned above for the optional patterned bottom antireflective coating 40 and the overlying patterned photoresist 42. The second patterned mask 52 can also be formed using the processing mentioned above in forming first patterned mask 38.

Figure 7:
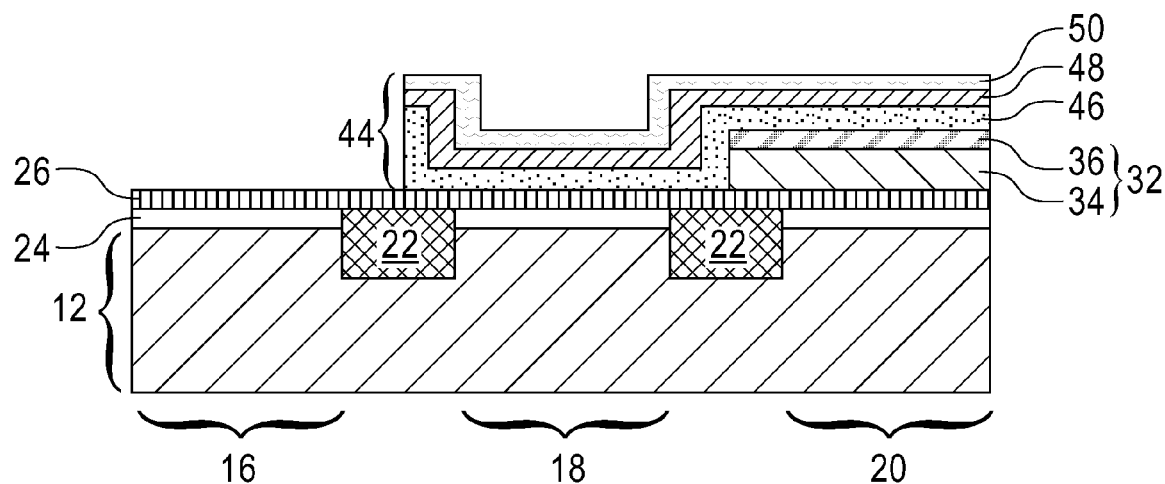
FIG. 7 is a pictorial representation (through a cross sectional view) depicting the structure of FIG. 6 after removing the material layers located above the high k gate dielectric in the nMOS device region that are not protected by the second patterned mask and subsequent removal of the second patterned mask.

Referring to FIG. 7, there is shown the structure of FIG. 6 after removing the exposed material layers located above the high k gate dielectric layer 26 in the nMOS device region 16 that are not protected by second patterned mask 52 and subsequent removal of the second patterned mask 52. The removing the exposed portion of the material layers within the nMOS device region 16 is performed utilizing an etching process that is selective in removing the exposed portion of the materials layers within the nMOS device region 16 relative to the second patterned mask 52, while stopping on an upper surface of the high k gate dielectric layer 26. In one embodiment, the exposed portion of the material layers within the nMOS device region 16 that is not protected by the second patterned mask 52 is removed by an ammonia peroxide mixture (APM). The second patterned mask 52 can be removed utilizing a conventional resist stripping process such as, for example, ashing.

Figure 8:
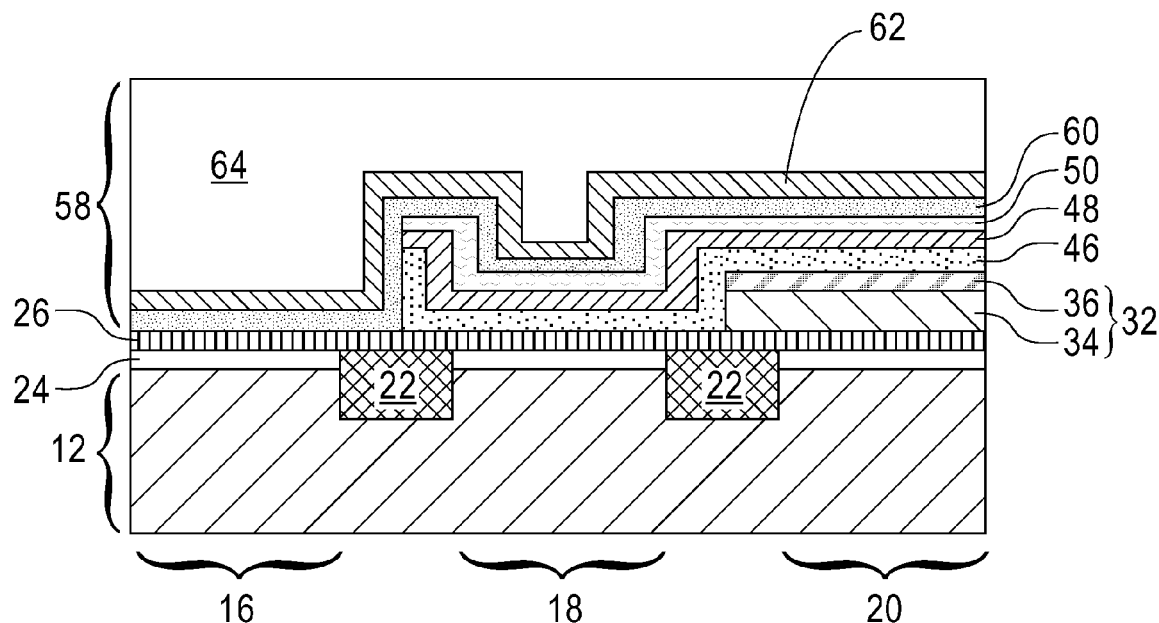
FIG. 8 is a pictorial representation (through a cross sectional view) depicting the structure of FIG. 7 after forming a material stack including, for bottom to top, an nFET threshold voltage adjusting material layer, a third barrier layer, and a Si-containing layer in each of the device regions, wherein in the nMOS device region the nFET threshold voltage adjusting material layer is in direct contact with a portion of the high k gate dielectric layer.

Referring to FIG. 8, there is shown the structure of FIG. 7 after forming a material stack 58 including, for bottom to top, an nFET threshold voltage adjusting material layer 60, a third barrier layer 62, and a Si-containing layer 64 in each of the device regions, wherein in the nMOS device region 16 the nFET threshold voltage adjusting material layer 60 is in direct contact with a portion of the high k gate dielectric layer 26.

The nFET threshold voltage adjusting material layer 60 includes a material that moves the threshold voltage of a gate stack towards the nFET band edge. One example of an nFET threshold voltage adjusting material that can be used as layer 60 is a rare earth metal-containing material that comprises an oxide or nitride of at least one element from Group IIIB of the Periodic Table of Elements (CAS version) including, for example, La, Ce, Pr, Nd, Pm, Sm, Eu, Ga, Tb, Dy, Ho, Er, Tm, Yb, Lu or mixtures thereof. Preferably, the rare earth metal-containing material comprises an oxide of La, Ce, Y, Sm, Er and/or Tb, with $La_2O_3$ being more preferred.

The rare earth metal-containing material can be formed utilizing a conventional deposition process including, for example, evaporation, molecular beam deposition, metal-organic chemical vapor deposition (MOCVD), atomic layer deposition (ALD), physical vapor deposition (PVD), ionized PVD and other like deposition processes. In one embodiment of the present disclosure, the rare earth metal-containing material can be formed by placing the structure including the high k gate dielectric into the load-lock of a molecular beam deposition chamber, followed by pumping this chamber down to the range of $10^{-5}$ Torr to $10^{-8}$ Torr. After these steps, the structure is inserted, without breaking vacuum into the growth chamber where the rare earth metal-containing material such as La oxide is deposited by directing atomic/molecular beams of the rare earth metal and oxygen or nitrogen onto the structure's surface. Specifically, because of the low pressure of the chamber, the released atomic/molecular species are beamlike and are not scattered prior to arriving at the structure. A substrate temperature of about 300° C. is used. In the case of $La_2O_3$ deposition, the La evaporation cell is held in the temperature range of 1400° C. to 1700° C., and a flow rate of 1 sccm to 3 sccm of molecular oxygen is used. Alternatively, atomic or excited oxygen may be used as well, and this can be created by passing the oxygen through a radio frequency source excited in the range of 50 Watts to 600 Watts. During the deposition, the pressure within the chamber can be in the range from $1\times10^{-5}$ Torr to $8\times10^{-5}$ Torr, and the La oxide growth rate can be in the range from 0.1 nm per minute to 2 nm per minute, with a range from 0.5 nm per minute to 1.5 nm per minute being more typical.

Another example of an nFET threshold voltage adjusting material that can be employed as layer 60 is an alkaline earth metal-containing material that comprises a compound having the formula $MA_x$ wherein M is an alkaline earth metal (Be, Mg, Ca, Sr, and/or Ba), A is one of O, S and a halide, and x is 1 or 2. Alkaline earth metal-containing compounds that include a mixture of alkaline earth metals and/or a mixture of anions, such as an oxychloride can also be used as an nFET threshold voltage adjusting material. Examples of alkaline earth metal-containing compounds that can be used include, but are not limited to $MgO$, $MgS$, $MgF_2$, $MgCl_2$, $MgBr_2$, $MgI_2$, $CaO$, $CaS$, $CaF_2$, $CaCl_2$, $CaBr_2$, $CaI_2$, $SrO$, $SrS$, $SrF_2$, $SrCl_2$, $SrBr_2$, $SrI_2$, $BaO$, $BaS$, $BaF_2$, $BaCl_2$, $BaBr_2$, and $BaI_2$. In one preferred embodiment of the present disclosure, the alkaline earth metal-containing compound includes Mg. MgO is a highly preferred alkaline earth metal-containing material employed in one embodiment of the present disclosure.

The alkaline earth metal-containing material can be formed utilizing a conventional deposition process including, for example, sputtering from a target, reactive sputtering of an alkaline earth metal under oxygen plasma conditions, electroplating, evaporation, molecular beam deposition, MOCVD, ALD, PVD, ionized PVD and other like deposition processes.

The thickness of the nFET threshold voltage adjusting material layer 60 may vary depending on the type of nFET threshold voltage adjusting material employed as well as the technique that was used in forming the same. Typically, the nFET threshold voltage adjusting material layer 50 has a thickness from 0.1 nm to 5.0 nm, with a thickness from 1.0 nm to 3.0 nm being more typical.

The third barrier layer 62 can comprise one of the metal nitrides mentioned above for the first barrier layer 34. In one embodiment, the third barrier layer 62 can be comprised of TiN. The third barrier layer 62 can be formed using one of the techniques mentioned above for the first barrier layer 34 and the thickness of the third barrier layer 62 is within the thickness regime mentioned above for the first barrier layer 34.

The Si-containing layer 64 can be any material layer that includes silicon including, for example, amorphous silicon. The Si-containing layer 64 can be formed utilizing a conventional deposition process such as, for example, chemical vapor deposition and plasma enhanced chemical vapor deposition. The thickness of the Si-containing layer 64 may vary depending on the type of silicon material employed as well as the process that was employed in forming the same. Typically, the Si-containing layer 64 has a thickness from 5 nm to 100 nm, with a thickness from 20 nm to 60 nm being more typical.

Figure 9:
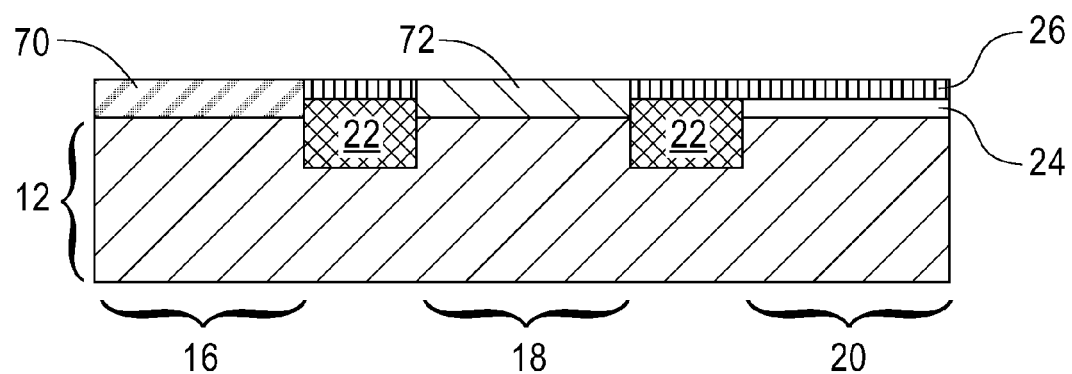
FIG. 9 is a pictorial representation (through a cross sectional view) depicting the structure of FIG. 8 after performing a drive in anneal and removing the various layers atop the high k gate dielectric layer in the various device regions.

Referring to FIG. 9, there is shown the structure of FIG. 8 after performing a drive in anneal and removing the various layers atop the high k gate dielectric layer 26 in the various device regions. The drive in anneal causes diffusion of the dopants, e.g., rare earth metal, or alkaline earth metal, from the nFET threshold voltage adjusting material layer 60 and dopants, e.g., Al, Ge, Ti and Ta, from the pFET threshold voltage adjusting material layer 46 into the underlying portions of the high k gate dielectric layer 26 and, if present, the chemox layer 24. In FIG. 9, reference numeral 70 denotes portions of the high k gate dielectric layer and the optional chemox layer in the nMOS device region 16 that include dopants from the nFET threshold voltage adjusting material layer diffused therein, while reference numeral 72 denotes a portion of the high k gate dielectric layer and the optional chemox layer in the pMOS device region 18 that include dopants from the pFET threshold voltage adjusting material layer 46 diffused therein. It is observed that regions 70 and 72 are gate dielectric-containing threshold voltage adjusted regions of the structure of the present disclosure.

The diffusion of the dopants from the nFET threshold voltage adjusting material layer and pFET threshold voltage adjusting material layer into the high k gate dielectric layer and, if present, the optional chemox layer, is performed utilizing an annealing step. It should be noted that in some instances the lower portion of the chemox layer that is adjacent to the upper surface of the semiconductor substrate may not include dopants from the nFET threshold voltage adjusting material layer or pFET threshold voltage adjusting material layer.

The anneal that can be performed to provide the threshold voltage adjusted structure shown in FIG. 9 is conducted at a temperature from 800° C. to 1200° C., with a temperature from 900° C. to 1000° C. being more typical. The anneal can be performed in an inert ambient such as, for example, He, Ar, and/or Xe. The anneal used in this step of the present disclosure may be a furnace anneal, a rapid thermal anneal, a laser anneal or a microwave anneal. The duration of the anneal varies depending on the type of anneal employed.

After the diffusion anneal, the various material layers within each device region that lay atop the high k gate dielectric 26 as well as atop the threshold voltage adjusted regions 70 and 72 are removed utilizing one or more etching process including dry etch and/or wet chemical etching. It is noted that the structure shown in FIG. 9 is a threshold voltage adjusted structure. By "threshold voltage adjusted structure" it is meant, localized regions of the structure have been tuned to retain the pre-determined threshold shifting materials there by to provide the suitable shift in those localized regions with the use of a common metal electrode.

Figure 10:
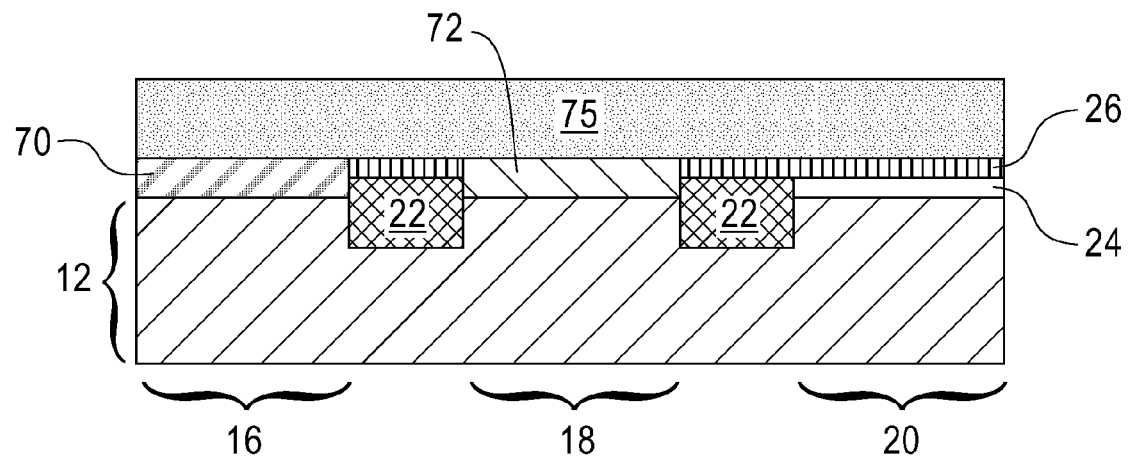
FIG. 10 is a pictorial representation (through a cross sectional view) depicting the threshold voltage adjusted structure of FIG. 9 after forming a conductive material in each of the device regions.

Referring to FIG. 10, there is shown the structure of FIG. 9 after forming a conductive material 75 atop the threshold voltage adjusted structure in each of the device regions. The conductive material 75 that is employed may comprise any conductive material including, but not limited to, polycrystalline silicon, polycrystalline silicon germanium, an elemental metal, (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayers thereof. In one embodiment, the conductive material 75 is comprised of TiN.

In some instances, a single layer of conductive material 75 is formed. In another instances, a first layer of conductive material and a second layer of conductive material are formed. In one embodiment, conductive material 75 may include a stack, from bottom to top, of a conductive metal layer and an upper conductive Si-containing material layer; the conductive metal layer has a higher conductivity than the conductive Si-containing material layer.

The conductive material 75 can be formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other liked deposition processes. When Si-containing materials are used as the conductive material 75, the Si-containing materials can be doped within an appropriate impurity by utilizing either an in-situ doping deposition process or by utilizing deposition, followed by a step such as ion implantation in which the appropriate impurity is introduced into the Si-containing material. When a metal silicide is formed, a conventional silicidation process is employed.

The as deposited conductive material 75 typically has a thickness from 5 nm to 200 nm, with a thickness from 20 nm to 100 nm being more typical.

In some embodiments, an optional hard mask material (not shown) can be formed atop the conductive material 75. The optional hard mask material includes an oxide, a nitride, an oxynitride or any combination thereof including multilayered stacks. When present, the optional hard mask material is formed utilizing a conventional deposition process well known to those skilled in the art including, for example, CVD and PECVD. Alternatively, the optional hard mask material is formed by a thermal process such as, for example, oxidation and/or nitridation. The thickness of the optional hard mask material may vary depending on the exact hard mask material employed as well as the process that is used in forming the same. Typically, the hard mask material has a thickness from 5 nm to 200 nm, with a thickness from 10 nm to 50 nm being more typical. The hard mask material is typically employed when the conductive material is a Si-containing material such as polysilicon or SiGe.

Figure 11:
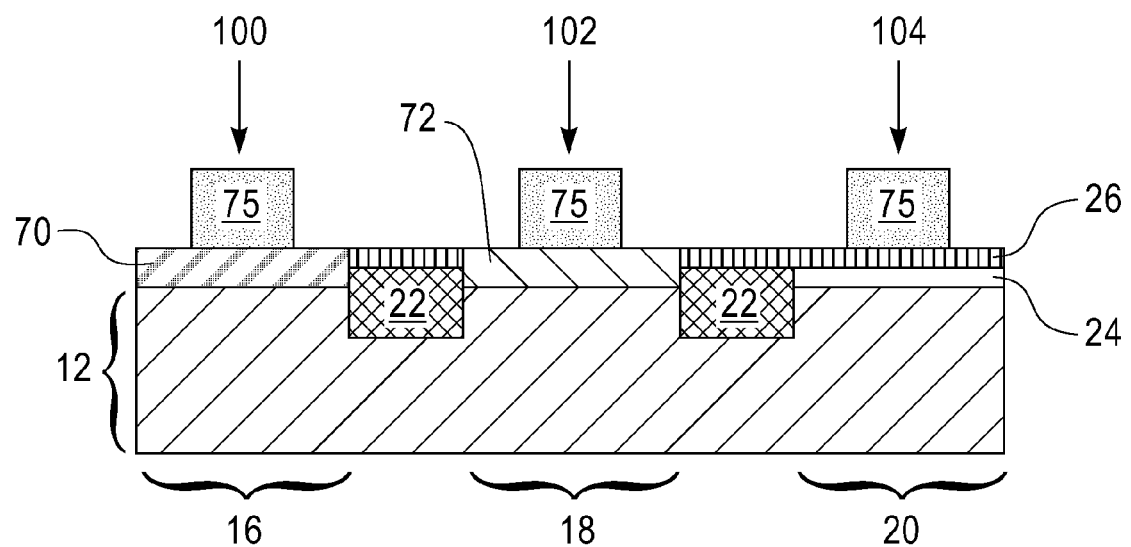
FIG. 11 is a pictorial representation (through a cross sectional vies) depicting the structure of FIG. 10 after performing a gate patterning step.

Next, at least the conductive material 75 within each of the device regions can be patterned by lithography and etching providing patterned gate stacks in each of the device regions. Such a structure is shown for example, in FIG. 11. In FIG. 11, reference numeral 100 denotes the patterned gate stack comprised of at least threshold voltage adjusted portion 70 and a portion of conductive material 75 within the nMOS device region 16, reference numeral 102 denotes the patterned gate stack comprised of at least threshold voltage adjusted region 72 and a portion of conductive material 75 within the pMOS device region 18, and reference numeral 104 denotes the patterned gate stack comprised of at least a portion of high k gate dielectric layer 26 and a portion of conductive material 75 within the mid gap nMOS/pMOS device region 20.

After providing the structure shown in FIG. 11 further CMOS device processing steps (not specifically shown) can be performed. The further CMOS device processing steps can include extension region formation, spacer formation, source/drain region formation, and formation of metal semiconductor alloy contacts atop at least each of the source/drain regions. In some embodiments, the patterned hard mask atop each of the patterned gate stacks can be removed prior to forming the contacts such that a metal semiconductor alloy contact can be formed atop the patterned conductive material.

The extension regions are formed utilizing any known extension ion implantation process. After the extension ion implantation, an anneal can be used to activate the implanted extension ions. The spacer is formed utilizing any known process including deposition of a spacer material, followed by etching. Typical spacer materials include an oxide and/or a nitride. After formation of the spacer, source/drain regions are formed into an upper exposed surface of the substrate at the footprint of each of the patterned gate stacks. The source/drain regions are formed utilizing a source/drain ion implantation process followed by annealing. The metal semiconductor alloy contacts are formed utilizing any process that is capable of forming a metal semiconductor alloy atop a semiconductor material. In one embodiment, the metal semiconductor alloy contacts can be formed utilizing a silicide process. The silicide process can be self-aligned to the outer edge of the spacer. The silicide process includes forming a metal capable of forming a metal semiconductor alloy when reacted with a semiconductor material. The metal used in forming the metal semiconductor alloy contact can include, but is not limited to, tantalum, titanium, tungsten, ruthenium, cobalt, nickel, or any suitable combination of those materials. A diffusion barrier such as titanium nitride or tantalum nitride can be formed atop the metal. An anneal is performed that causes reaction between the metal and the underlying semiconductor material forming metal semiconductor alloy regions. Typically, the anneal is performed at a temperature of at least 250° C. or above. A single anneal step or multiple anneal steps can be used. Any non-reacted metal and the optional diffusion barrier are removed after the anneal has been performed. In some embodiments, a metal semiconductor alloy contact can be formed directly atop the patterned conductive material, when no optional patterned hard mask is present and the conductive material is composed of a Si-containing material.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming multiple threshold voltage devices on a same semiconductor chip comprising:

providing an initial structure including a semiconductor substrate having at least an nMOS device region and a pMOS device region located therein, wherein a high k gate dielectric layer is located atop the semiconductor substrate in each of the device regions;

forming a disposable mask atop the high k gate dielectric in each of the device regions;

forming a first patterned mask protecting one of device regions, while leaving the other device region unprotected;

removing an exposed portion of the disposable mask in the device region not protected by the first patterned mask to expose an underlying portion of the high k gate dielectric layer and removing the first patterned mask;

forming a first material stack including a bottom layer comprising either an nFET threshold voltage adjusting material layer or a pFET threshold voltage adjusting material layer in each device region, wherein a portion of the nFET or pFET threshold voltage adjusting material layer is in contact with the exposed portion of the high k gate dielectric layer in the one device region;

forming a second patterned mask atop the first material stack in the one device region, while leaving the other device region unprotected;

removing exposed material layers within the other device region, stopping atop a portion of the high k gate dielectric layer in the other device region and removing the second patterned mask;

forming a second material stack including a bottom layer comprising the other of the pFET or nFET threshold voltage adjusting material layer not present in the first material stack in each device region, wherein a portion of the pFET or nFET threshold voltage adjusting material layer of the second material stack is in contact with the exposed portion of the high k gate dielectric in the other device region;

performing an anneal, wherein the portion of the high k gate dielectric layer that is in contact with the nFET threshold voltage adjusting material layer is converted to a dielectric-containing nFET threshold voltage adjusted region and wherein the portion of the high k gate dielectric layer that is in contact with the pFET threshold voltage adjusting material layer is converted to a dielectric-containing pFET threshold voltage adjusted region; and removing all material layers located above the dielectric-containing nFET threshold voltage adjusted region and the dielectric-containing pFET threshold voltage adjusted region.

2. The method of claim 1 further comprising a mid gap nMOS/pMOS device region, wherein said mid gap nMOS/pMOS device region remains protected during processing said nMOS and pMOS device regions.

3. The method of claim 1 wherein said forming the disposable mask atop the high k gate dielectric layer in each of the device regions comprises, from bottom to top, a barrier metal nitride layer and a barrier coating layer.

4. The method of claim 1 wherein said first material stack further includes a barrier metal nitride layer and a barrier coating layer atop the bottom layer.

5. The method of claim 4 wherein said bottom layer comprises said pFET threshold voltage adjusting material layer, and said pFET threshold voltage adjusting material includes Al, Ge, Ti or Ta.

6. The method of claim 5 wherein said second material stack further includes another barrier metal nitride layer and a Si-containing layer, and said bottom layer is an nFET threshold voltage adjusting material layer selected from a Group IIIB rare earth metal or a rare earth metal-containing material that comprises an oxide or nitride of at least one element from Group IIIB of the Periodic Table of Elements, and an alkaline earth metal containing material that comprises a compound of the formula $MA_x$ wherein M is an alkaline earth metal, A is one of O, S and a halide, and x is 0, 1 or 2.

7. The method of claim 4 wherein said bottom layer comprises said nFET threshold voltage adjusting material layer, and said nFET threshold voltage adjusting material is selected from a Group IIIB rare earth metal or a rare earth metal-containing material that comprises an oxide or nitride of at least one element from Group IIIB of the Periodic Table of Elements, and an alkaline earth metal containing material that comprises a compound of the formula $MA_x$ wherein M is an alkaline earth metal, A is one of O, S and a halide, and x is 0, 1 or 2.

8. The method of claim 7 wherein said second material stack further includes another metal nitride barrier layer and a Si-containing layer.

9. The method of claim 1 wherein said anneal is performed at a temperature from 800° C. to 1200° C.

10. The method of claim 1 further comprising forming a conductive material atop said dielectric-containing nFET threshold voltage adjusted region and said dielectric-containing pFET threshold voltage adjusted region and patterning at least said conductive material to provide a patterned gate stack in each device region.

11. The method of claim 1 further comprising a semiconductor layer having a different lattice constant than the semiconductor substrate in said pMOS device region and located beneath said high k gate dielectric layer.

12. A method of forming multiple threshold voltage devices on a same semiconductor chip comprising:

providing an initial structure including a semiconductor substrate having at least an nMOS device region and a pMOS device region located therein, wherein a high k gate dielectric layer is located atop the semiconductor substrate in each of the device regions;

forming a disposable mask atop the high k gate dielectric layer in each of the device regions;

forming a first patterned mask protecting the nMOS device region, while leaving the pMOS region unprotected;

removing an exposed portion of the disposable mask in the pMOS device region not protected by the first patterned mask to expose an underlying portion of the high k gate dielectric layer and removing said first patterned mask;

forming a first material stack including a bottom layer comprising a pFET threshold voltage adjusting material layer in each device region, wherein a portion of said pFET threshold voltage adjusting material layer is in contact with the exposed portion of the high k gate dielectric layer in the pMOS device region;

forming a second patterned mask atop the first material stack in the pMOS device region, while leaving the nMOS device region unprotected;

removing exposed material layers within the nMOS device region, stopping atop a portion of the high k gate dielectric layer in the nMOS device region and removing said second patterned mask;

forming a second material stack including a bottom layer comprising an nFET threshold voltage adjusting material layer in each device region, wherein a portion of said nFET threshold voltage adjusting material layer is in contact with the exposed portion of the high k gate dielectric layer in the nMOS device region;

performing an anneal, wherein the portion of the high k gate dielectric layer that is in contact with the nFET threshold voltage adjusting material layer is converted to a dielectric-containing nFET threshold voltage adjusted region and wherein the portion of the high k gate dielectric layer that is in contact with the pFET threshold voltage adjusting material layer is converted to a dielectric-containing pFET threshold voltage adjusted region; and removing all material layers located above said dielectric-containing nFET threshold voltage adjusted region and said dielectric-containing pFET threshold voltage adjusted region.

13. The method of claim 12 further comprising a mid gap nMOS/pMOS device region, wherein said mid gap nMOS/pMOS device region remains protected during processing said nMOS and pMOS device regions.

14. The method of claim 12 wherein said forming the disposable mask atop the high k gate dielectric layer in each of the device regions comprises, from bottom to top, a barrier metal nitride layer and a barrier coating layer.

15. The method of claim 12 wherein said first material stack further includes a barrier metal nitride layer and a barrier coating layer atop the bottom layer, and said pFET threshold voltage adjusting material layer comprises Al, Ge, Ti or Ta.

16. The method of claim 12 wherein said second material stack further includes a barrier metal nitride layer and a Si-containing layer, and said nFET threshold voltage adjusting material layer comprises a Group IIIB rare earth metal or a rare earth metal-containing material that comprises an oxide or nitride of at least one element from Group IIIB of the Periodic Table of Elements, or an alkaline earth metal containing material that comprises a compound of the formula $MA_x$ wherein M is an alkaline earth metal, A is one of O, S and a halide, and x is 0, 1 or 2.

17. The method of claim 12 wherein said anneal is performed at a temperature from 800° C. to 1200° C.

18. The method of claim 12 further comprising forming a conductive material atop said dielectric-containing nFET threshold voltage adjusted region and said dielectric-containing pFET threshold voltage adjusted region and patterning at least said conductive material to provide a patterned gate stack in each device region.

19. The method of claim 12 further comprising a semiconductor layer having a different lattice constant than the semiconductor substrate in said pMOS device region and located beneath said high k gate dielectric layer.

20. A method of forming multiple threshold voltage devices on a same semiconductor chip comprising:
providing an initial structure including a semiconductor substrate having at least an nMOS device region and a pMOS device region located therein, wherein a high k gate dielectric layer is located atop the semiconductor substrate in each of the device regions;
forming a disposable mask atop the high k gate dielectric layer in each of the device regions;
forming a first patterned mask protecting the pMOS device region, while leaving the nMOS region unprotected;
removing an exposed portion of the disposable mask in the nMOS device region not protected by the first patterned mask to expose an underlying portion of the high k gate dielectric layer and removing said first patterned mask;
forming a first material stack including a bottom layer comprising an nFET threshold voltage adjusting material layer in each device region, wherein a portion of said nFET threshold voltage adjusting material layer is in contact with the exposed portion of the high k gate dielectric layer in the nMOS device region;
forming a second patterned mask atop the first material stack in the nMOS device region, while leaving the pMOS device region unprotected;
removing exposed material layers within the pMOS device region, stopping atop a portion of the high k gate dielectric layer in the pMOS device region and removing said second patterned mask;
forming a second material stack including a bottom layer comprising a pFET threshold voltage adjusting material layer in each device region, wherein a portion of said pFET threshold voltage adjusting material layer is in contact with the exposed portion of the high k gate dielectric layer in the pMOS device region;
performing an anneal, wherein the portion of the high k gate dielectric layer that is in contact with the nFET threshold voltage adjusting material layer is converted to a dielectric-containing nFET threshold voltage adjusted region and wherein the portion of the high k gate dielectric layer that is in contact with the pFET threshold voltage adjusting material layer is converted to a dielectric-containing pFET threshold voltage adjusted region; and
removing all material layers located above said dielectric-containing nFET threshold voltage adjusted region and said dielectric-containing pFET threshold voltage adjusted region.

21. The method of claim 20 further comprising a mid gap nMOS/pMOS device region, wherein said mid gap nMOS/pMOS device region remains protected during processing said nMOS and pMOS device regions.

22. The method of claim 20 wherein said forming the disposable mask atop the high k gate dielectric layer in each of the device regions comprises, from bottom to top, a barrier metal nitride layer and a barrier coating layer.

23. The method of claim 20 wherein said first material stack further includes a barrier metal nitride layer and a barrier coating layer atop the bottom layer, and said nFET threshold voltage adjusting material layer comprises a Group IIIB rare earth metal or a rare earth metal-containing material that comprises an oxide or nitride of at least one element from Group IIIB of the Periodic Table of Elements, or an alkaline earth metal containing material that comprises a compound of the formula $MA_x$ wherein M is an alkaline earth metal, A is one of O, S and a halide, and x is 0, 1 or 2.

24. The method of claim 20 wherein said second material stack further includes a barrier metal nitride layer and a Si-containing layer, and said pFET threshold voltage adjusting material layer comprises Al, Ge, Ti or Ta.

25. The method of claim 20 wherein said anneal is performed at a temperature from 800° C. to 1200° C.

26. The method of claim 20 further comprising forming a conductive material atop said dielectric-containing nFET threshold voltage adjusted region and said dielectric-containing pFET threshold voltage adjusted region and patterning at least said conductive material to provide a patterned gate stack in each device region.

27. The method of claim 20 further comprising a semiconductor layer having a different lattice constant than the semiconductor substrate in said pMOS device region and located beneath said high k gate dielectric layer.

* * * * *